United States Patent [19]
Nagabushnam et al.

[11] Patent Number: 5,888,588
[45] Date of Patent: Mar. 30, 1999

[54] PROCESS FOR FORMING A SEMICONDUCTOR DEVICE

[75] Inventors: Rajan Nagabushnam; Olubunmi Adetutu; Yeong-Jyh Tom Lii, all of Austin, Tex.

[73] Assignee: Motorola, Inc., Schaumburg, Ill.

[21] Appl. No.: 828,638

[22] Filed: Mar. 31, 1997

[51] Int. Cl.$^6$ .......................... C23C 16/00; H01L 21/285
[52] U.S. Cl. ..................... 427/248.1; 427/255.2; 427/255.1; 427/255; 427/255.7; 438/592; 438/655; 438/680; 438/706
[58] Field of Search ............... 427/248.1, 255, 427/255.2, 255.1, 255.7; 438/592, 655, 680, 706

[56] References Cited

U.S. PATENT DOCUMENTS

| | | | |
|---|---|---|---|
| 4,490,209 | 12/1984 | Hartman | 156/643 |
| 4,684,542 | 8/1987 | Jasinski et al. | 437/245 |
| 4,847,111 | 7/1989 | Chow et al. | 427/38 |
| 4,977,100 | 12/1990 | Shimura | 437/44 |
| 5,066,615 | 11/1991 | Brady et al. | 437/229 |
| 5,200,028 | 4/1993 | Tatsumi | 156/656 |
| 5,341,016 | 8/1994 | Prall et al. | 257/412 |
| 5,364,803 | 11/1994 | Lur et al. | 437/40 |
| 5,559,047 | 9/1996 | Urabe | 437/41 |
| 5,691,235 | 11/1997 | Meikle et al. | 437/190 |
| 5,716,881 | 2/1998 | Liang et al. | 438/238 |

FOREIGN PATENT DOCUMENTS

| | | | |
|---|---|---|---|
| 07-180058 | 7/1995 | Japan | C23C 16/34 |

OTHER PUBLICATIONS

Wolf, et al.; Silicon Processing For The VLSI Era; vol. 1: Process Technology; pp. 374 (1986).

Akasaka, et al.; "Low-Resistivity Poly-Metal Gate Electrode Durable for High-Temperature Processing"; IEEE Transactions on Electron Devices; vol. 43, No. 11; pp. 1864–1868; (1996).

Kasai, et al.; "W/WNx/Poly-Si Gate Technology for Future High Speed Deep Submicron CMOS LSIs"; IEDM; pp. 497–500 (1994).

Fix; "Chemical Vapor Deposition of Vanadium, Niobium, and Tantalum Nitride Thin Films"; Chemical Mater. vol. 5; pp. 614–619 (1993).

Wright, et al.; "The Effect of Fluorine in Silicon Dioxide Gate Dielectrics"; IEEE Transactions of Electron Devices; vol. 36, No. 5; pp. 879–889 (1989).

He, et al.; "Microstructure and properties of Ti-Si-N films prepared by plasma-enhanced chemical vapor deposition"; Materials Chemistry and Physics; 44; pp. 9–16 (1996).

Shizhi, et al.; "Ti-Si-N Films Prepared by Plasma-Enhanced Chemical Vapor Deposition"; Plasma Chemistry and Plasma Processing; vol. 12, No. 3; pp. 287–297 (1992).

Chiou, et al.; "Microstructure and Properties of Multilayer-Derived Tungsten Silicide"; Journal of Electronic Materials, vol. 16; No. 4; pp. 251–255 (1987).

*Primary Examiner*—Roy V. King
*Attorney, Agent, or Firm*—George R. Meyer

[57] ABSTRACT

A semiconductor device (10) includes a gate electrode (61) having a silicon/tungsten nitride/tungsten silicon nitride/tungsten silicide composition. The tungsten nitride film (21) and tungsten suicide film (23) are formed using chemical vapor deposition (CVD). The tungsten nitride film is formed using a tungsten halide and $N_2R^1R^2$, where each of $R^1$ and $R^2$ is hydrogen, an alkyl group, an alkenyl group, or an alkynyl group. The tungsten nitride film (21) is an etch stop when patterning the tungsten silicide film (23). The CVD tungsten nitride film (21) helps to improve gate dielectric integrity and reduces interface traps when compared to a sputtered tungsten nitride film (21). Also, $N_2R^1R^2$ can be used to remove halogens that are adsorbed onto walls of a reaction chamber than is cleaned between depositions of substrates.

27 Claims, 3 Drawing Sheets

PROCESS FOR FORMING A SEMICONDUCTOR DEVICE

RELATED APPLICATIONS

This is related to U.S. patent application Ser. Nos. 08/828,635; 08/829,405; 08/829,752; 08/831,286; and 08/831,287, all filed on Mar. 31, 1997, and assigned to the current assignee hereof.

FIELD OF THE INVENTION

This invention relates in general to processes for forming semiconductor devices, and more particularly, processes for forming semiconductor devices with refractory metal-containing electrodes.

BACKGROUND OF THE INVENTION

In many very large scale integration (VLSI) semiconductor devices, polycrystalline silicon (polysilicon) gates are formed over a gate dielectric layer. Due to the relatively high resistance values of the polysilicon film, a tungsten silicide film is often formed to lower resistance along the polysilicon gate. Generally, the tungsten silicide film is formed using tungsten hexafluoride ($WF_6$) and silane $SiH_4$). The fluorine from the tungsten hexafluoride can passivate interface traps, which is good. However, the fluorine can also break the silicon-oxygen bond at the silicon-gate oxide interface, which is undesired because it creates more silicon dangling bonds, increases the gate dielectric layer thickness, and decreases the dielectric constant of the gate dielectric layer.

One attempt to reduce the problem with the fluorine is to increase the ratio of silane to tungsten hexafluoride during the tungsten silicide formation. Typically, the tungsten silicide film is formed with a ratio of silicon to tungsten of approximately 2.1:1 to 2.6:1. However, the increased silicon content increases the resistivity of the tungsten silicide film.

Another attempt to reduce the fluorine-related problems is to form sputtered tungsten silicide film by sputter deposition. However, this is done at the expense of increased particle problems. Similarly, a tungsten nitride film can be placed between the polysilicon and the tungsten silicide, but the tungsten nitride is typically formed by sputter deposition. Again, sputtering usually has more particle problems than chemical vapor depositions.

A need exists to form a gate electrode that does not cause gate dielectric thickening or other changes that affect the electrical performance of a semiconductor device. A need further exists to form the gate electrode without having to develop complex processing steps.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A semiconductor device includes a gate electrode having a silicon/tungsten nitride/tungsten silicon nitride/tungsten silicide composition. The tungsten nitride and tungsten silicide are formed using chemical vapor deposition (CVD). The tungsten nitride film is formed using a tungsten halide and $N_2R^1R^2$ (a hydrazine compound), where each of $R^1$ and $R^2$ is hydrogen, an alkyl group, an alkenyl group, or an alkynyl group. In this specification, superscripts are used for the radical groups because subscripts are used to denote the atomic content. For example, the "$N_2$" indicates that there are two nitrogen atoms, whereas each of $R_1$ and $R^2$ is one radical group. $N_2R^1R^2$ can be hydrazine ($N_2H_2$), methyl hydrazine ($N_2HCH_3$), ethyl hydrazine ($N_2HC_2H_5$), or the like. The tungsten nitride film is an etch stop when patterning the tungsten silicide film. The CVD tungsten nitride film helps to improve gate dielectric integrity and reduces interface traps when compared to a sputtered tungsten nitride film. The present invention is better understood with the embodiments described below.

Figure 1:
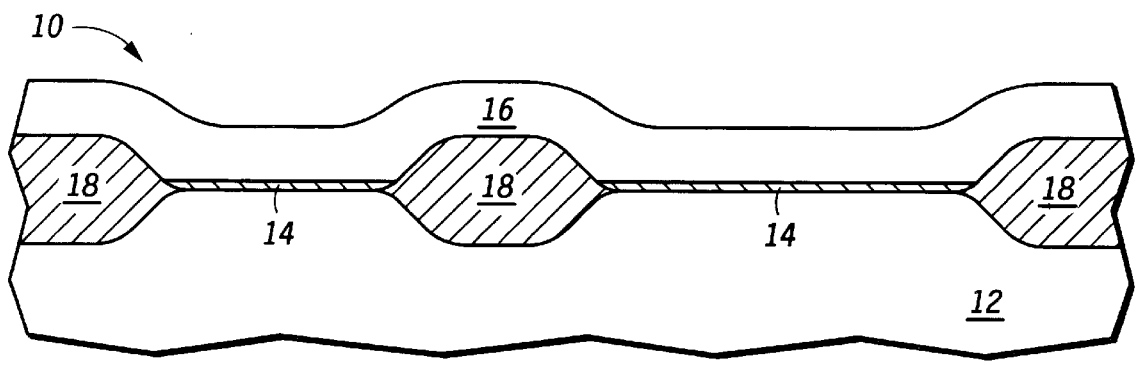
FIG. 1 includes an illustration of a cross-sectional view of a portion of a semiconductor device substrate after forming field isolation regions, a gate dielectric layer, and a polysilicon film.

FIG. 1 includes an illustration of a portion of a semiconductor device substrate 12 after performing several processing steps. The substrate 12 includes a monocrystalline semiconductor wafer, a semiconductor-on-insulator wafer, or any other substrate used to form semiconductor devices. Field isolation regions 18 and a gate dielectric layer 14 overlie the substrate 12. The field isolation regions 18 are formed by a selective oxidation process or a trench isolation process. The gate dielectric layer 14, which is an insulating layer, includes silicon dioxide, a nitrided oxide, or the like. A silicon film 16 overlies the gate dielectric layer 14 and is a doped polysilicon or doped amorphous silicon film. The dopant for the silicon film is introduced in-situ during the deposition or as a separate doping step following deposition.

Figure 2:
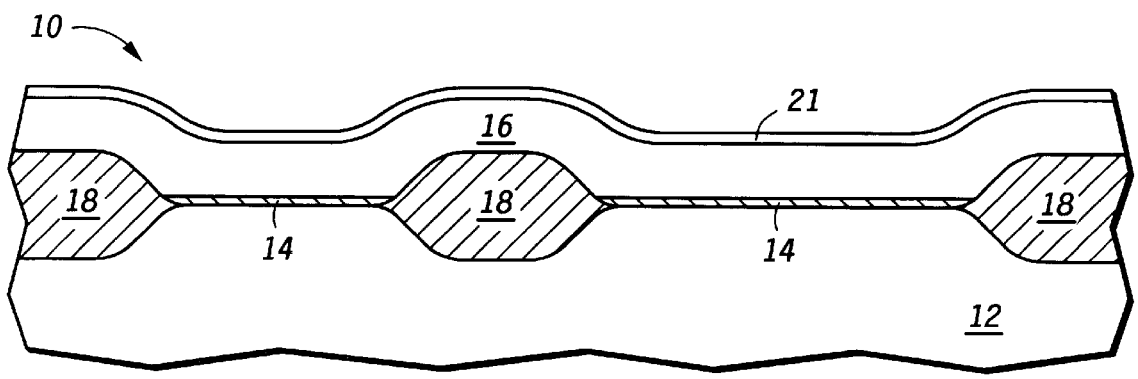
FIG. 2 includes an illustration of a cross-sectional view of the substrate of FIG. 1 after a tungsten nitride film in accordance of one embodiment of the present invention.

A tungsten nitride ($WN_x$) film 21 is formed by chemical vapor deposition over the silicon film 16 in FIG. 2. The tungsten source gas includes tungsten hexafluoride, tungsten hexachloride, another tungsten halide, or the like. The nitrogen source gas includes a material having a general formula of $N_2R^1R^2$, where each of $R^1$ and $R^2$ is hydrogen; an alkyl group, such as methyl, ethyl, and the like; an alkenyl group, such as ethenyl and the like; or an alkynyl group, such as ethynyl. The radical groups $R^1$ and $R^2$ can be the same or different. Generally, each radical group should have no more than three carbon atoms. In one specific embodiment, tungsten hexafluoride and methyl hydrazine are used. The gas flow rates during most of the deposition are in a range of approximately 4–8 standard cubic centimeters per minute (sccm) for tungsten hexafluoride and approximately 5–15 sccm for methyl hydrazine. The deposition is performed at a temperature is within a range of approximately 400–600 degrees Celsius, and at a pressure of approximately 0.3–0.9 torr.

The tungsten nitride film 21 has a composition and thickness sufficient to virtually prevent any fluorine from a subsequently formed tungsten silicide film from reaching the gate dielectric layer 14 and to virtually prevent any dopant from within the polysilicon film 16 from outgassing during subsequent processing steps. Typically, the tungsten nitride film 21 has a nitrogen content in a range of approximately 15–50 atomic percent nitrogen (in $WN_x$, where x is approximately 0.18–0.50) and a thickness in a range of approximately 50–150 angstroms, and more usually in a range of approximately 80–120 angstroms. The tungsten nitride film 21 becomes too resistive if the tungsten nitride film 21 has a nitrogen content is too high or is too thick. Typically the tungsten nitride film 21 is not stoichiometric and is tungsten rich.

Figure 3:
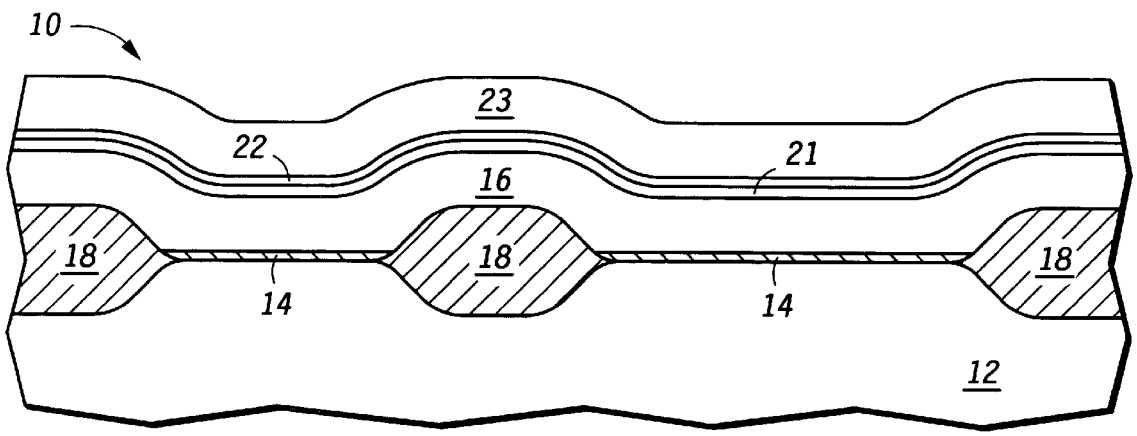
FIG. 3 includes an illustration of a cross-sectional view of the substrate of FIG. 1 after a tungsten silicide film over the tungsten nitride film.
Figure 4:
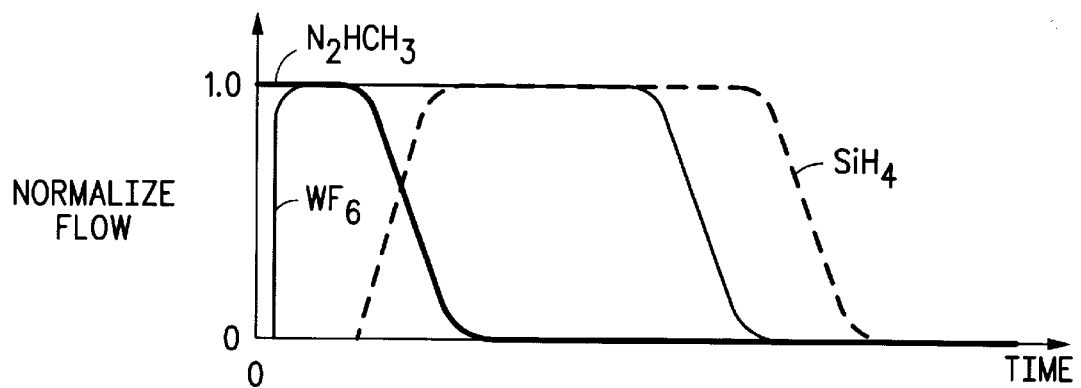
FIG. 4 includes a plot illustrating the normalized gas flow rates during the chemical vapor deposition of the tungsten nitride and tungsten silicide films.

A transition film 22 and a tungsten suicide ($WSi_x$) film 23 are also formed by chemical vapor deposition as seen in FIG. 3. Near the end of the deposition of the tungsten nitride film 21, the nitrogen source gas is gradually ramped down and a silicon source gas is ramped up as shown in FIG. 4. In FIG. 4, the heavier solid line represents the methyl hydrazine flow (nitrogen source gas), the lighter solid line represents the tungsten hexafluoride flow (tungsten source gas), and the dashed line represents the silane flow (silicon source gas). The normalized flow rates are the actual flow rate at a point in time divided by the maximum flow rate of that gas during the formation of the tungsten nitride and tungsten silicide films 21 and 23.

The gradual rampings of the nitrogen and silicon source gases form the transition film 22 that includes a tungsten silicon nitride compound. In one embodiment, the transition film 22 is a tungsten silicon nitride and is formed using tungsten hexafluoride, silane, and methyl hydrazine. The transition film 22 has a thickness in a range of approximately 50–100 angstroms. After the nitrogen source gas terminates, tungsten silicide is formed. The transition film 22 is not required but is typically formed because instantaneous rampings of the nitrogen source gas off and the silicon source gas to its setpoint to form the tungsten silicide film 23 should be avoided.

The silicon source gas includes silane, disilane, monochlorosilane, dichlorosilane, or the like. In one embodiment, silane flows at a rate of approximately 350–600 sccm. Otherwise, the deposition parameters are similar to those used for the tungsten nitride deposition. Because a tungsten nitride film 21 is present, the silicon to tungsten ratio in the tungsten silicide film 23 can be kept closer to two. The tungsten silicide film 23 should not be tungsten rich because of its reactivity with other chemicals used during subsequent processing (i.e., oxygen, etc.). The tungsten suicide film 23 has a thickness in a range of approximately 500–1500 angstroms.

The deposition of the tungsten nitride, transition, and tungsten suicide films 21–23 are performed in the same reaction chamber during the same evacuation cycle. The reaction chamber has a shower head and the substrate is heated using a susceptor heater. An example of such a reaction chamber is used on the Centura platform made by Applied Materials, Inc. of Santa Clara, Calif.

At this point in the process, the substrate 12 and films 21–23 are annealed at a temperature in a range of approximately 900–950 degrees Celsius for approximately 30 seconds. Unlike the prior art, the conductivity-type dopants (i.e., boron, phosphorus, arsenic, or the like) do not migrate from the silicon film 16 to the tungsten silicide film 23. Therefore, the resistivity of the silicon film 16 is better controlled and can be relatively higher compared to the prior art structure not having the tungsten nitride film 21.

Figure 5:
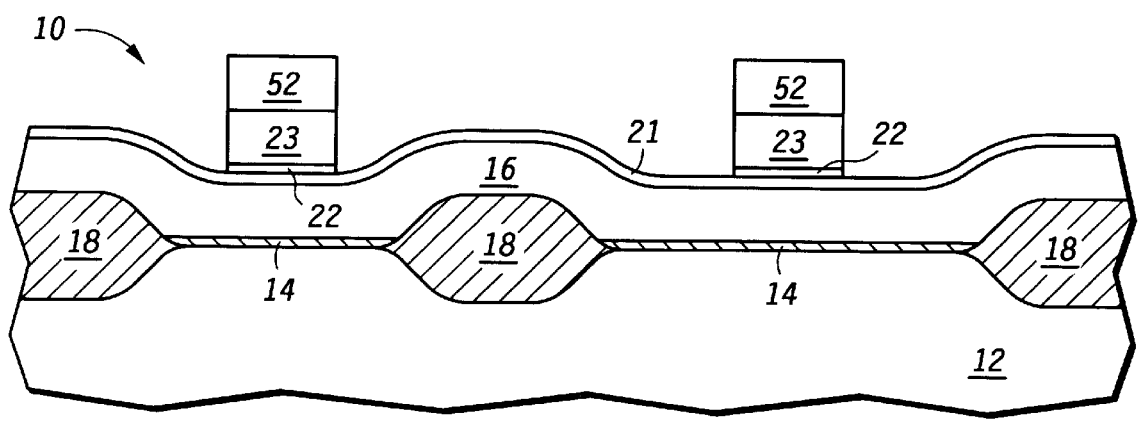
FIG. 5 includes an illustration of a cross-sectional view of the substrate of FIG. 3 after patterning the tungsten silicide film.

A resist layer is formed and patterned to form resist members 52 as shown in FIG. 5. Although not shown, an anti reflective film, such as a nitride, can be formed over the tungsten silicide film 23 before the resist layer is coated over the substrate 12. The tungsten silicide film 23 is etched using an etch chemistry including sulfur hexafluoride and hydrogen bromide. The etch is performed to expose the tungsten nitride film 21. The etch chemistry is switched to molecular chlorine and molecular oxygen. For the tungsten nitride film 21, the pressure is in a range of approximately 5–50 millitorr, the molecular chlorine flows at a rate of approximately 10–100 sccm, the molecular chlorine flows at a rate of approximately 1–10 sccm, and radio frequency power in a range of approximately 100–900 watts. The etch is performed to expose the silicon film 16. The silicon film 16 is etched using an etch chemistry of molecular chlorine and hydrogen bromide to expose the gate dielectric layer 14.

Figure 6:
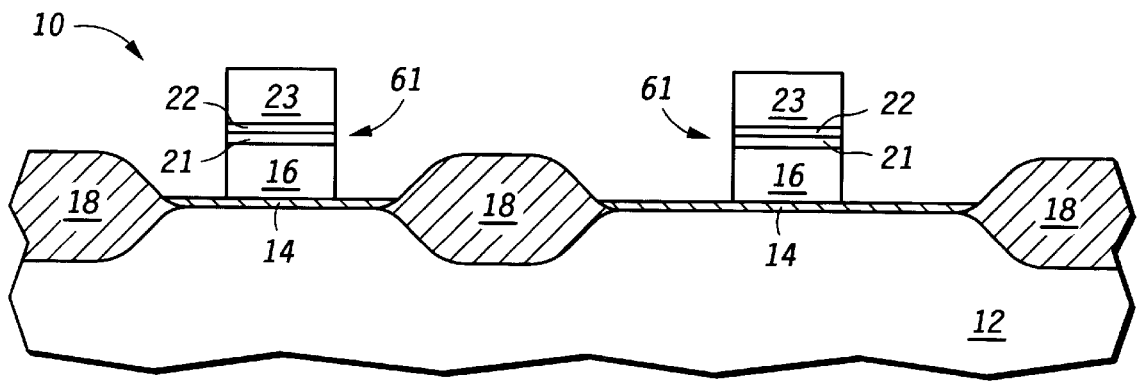
FIG. 6 includes an illustration of a cross-sectional view of the substrate of FIG. 5 after forming gate electrodes in accordance with an embodiment of the present invention.

The etching sequence is performed in the same etcher during the same evacuation cycle. In other embodiments, different etchers or different evacuation cycles are used between any two or all three steps of the sequence. Other etch chemistries may also be used. Sulfur hexafluoride can be replaced by another fluorine-containing compound, such as nitrogen trifluoride, fluorinated methanes and ethanes, and molecular chlorine can be replaced by another chlorine-containing compound, such as hydrogen chloride. For etches that include hydrogen bromide, the etch chemistry can include sulfur hexafluoride, a chlorine-containing compound, or both. The resist members 52 are ashed leaving gate electrodes 61 that include the silicon, tungsten nitride, transition, and tungsten silicide films 16, and 21–23 as illustrated in FIG. 6. An oxidation cycle is performed to oxidize a portion of the gate electrodes 61 to protect the gate electrodes 61 during subsequent processing steps.

Figure 7:
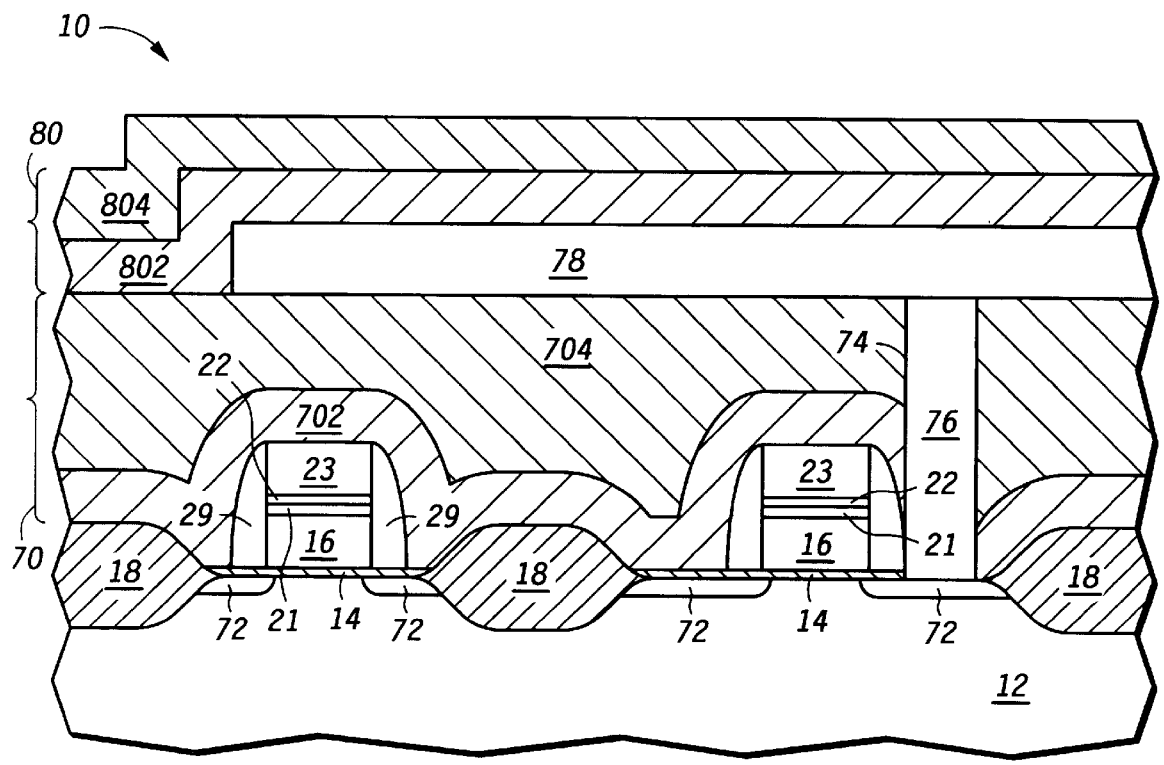
FIG. 7 includes an illustration of a cross-sectional view of the substrate of FIG. 6 after forming a substantially completed device.

The substrate is further processed to form a substantially completed semiconductor device 10 as shown in FIG. 7. Doped regions 72 are formed within the substrate 12 adjacent to the gate electrodes 61. The doped regions 72 are source/drain regions (current carrying electrodes) for the transistors shown in semiconductor device 10. Silicon nitride spacers 29 are formed adjacent to the sides of the gate electrodes 61 that include the silicon, tungsten nitride, transition, and tungsten silicide films 16, and 21–23. In interlevel dielectric (ILD) layer 70 includes an undoped oxide film 702 and a doped oxide film 704 that are formed by chemical vapor deposition. The doped oxide film 704 is typically a borophosphosilicate glass (BPSG). The undoped and doped oxide films 702 and 704 are patterned to form a contact opening 74. A conductive plug 76 is formed within the contact opening 74 and includes tungsten and adhesion/barrier films, such as titanium/titanium nitride.

An interconnect layer 78 is formed over the ILD layer 70 and the conductive plug 76. The interconnect layer 78 includes aluminum, copper or the like and is typically formed with an adhesion/barrier film or an anti reflective coating. In one embodiment, the adhesion/barrier film includes titanium/titanium nitride, and the anti reflective coating includes titanium nitride. A passivation layer 80 is formed over the interconnect layer 78 and exposed portions of the ILD layer 70. The passivation layer 80 includes a doped oxide film 802 and a silicon nitride film 804. Bond pads are formed through the passivation layer 80, and the semiconductor device is subsequently packaged.

The process can be used to form gate electrodes for memory cells within a memory array of semiconductor device 10. The memory array includes SRAM, DRAM, or flash nonvolatile memory. The memory array can be part of a stand alone memory device or part of a microprocessor, microcontroller, or the like.

The present invention includes benefits that are not seen with prior art methods. The tungsten nitride film 21 should essentially prevent gate dielectric layer thickening caused by fluorine in the tungsten hexafluoride. Also, although some fluorine reaches the gate dielectric layer-substrate interface, the concentration of fluorine should not be high enough to cause gate dielectric integrity problems. The fluorine reaching the interface during the tungsten nitride film 21 should help passivate interface traps and help the performance of the device. Such passivation would not occur if the tungsten nitride film 21 were sputter deposited. The tungsten silicide film 23 can have a concentration closer to the stoichiometric value ($WSi_x$, where x is closer to 2.0) because the tungsten nitride film 21 should essentially be a fluorine diffusion barrier during the tungsten silicide formation.

The tungsten nitride film 21 adheres well to the silicon film 16. A surface preclean used to improve adhesion between silicon and tungsten silicide is not needed. Also, the deposition of the tungsten nitride, transition, and tungsten silicide films 21–23 are performed during the same evacuation cycle. Therefore, additional handling and particle problems associated with that handling is not present.

The tungsten nitride film 21 improves the control over the gate electrode etch. More specifically, the chemistry used to etch the tungsten silicide film 23 etches silicon faster than tungsten silicide. The tungsten nitride film 21 is an etch stop and allows more control over etching the silicon film 16. This improves process margin.

The $N_2R^1R^2$ compound can be used to reduce the halogen content on the walls of the reaction chamber. A first substrate and the gate dielectric layer 14 is processed in a reaction chamber to form films 21–23. After depositing films 21–23, the first substrate is removed the reaction chamber is cleaned using a fluorine-containing gas, such as nitrogen trifluoride ($NF_3$). Fluorine is adsorbed onto the surfaces within the reaction chamber during the reaction chamber clean. The $N_2R^1R^2$ reacts with the fluorine on the surfaces and is removed by the vacuum pump. This fluorine reduction step can be performed between processing substrates or as part of the $N_2R^1R^2$ flow before forming the films 21–23 on a subsequent substrate. Clearly, this process can be extended to chemical vapor depositions of other refractory metal nitrides, other refractory metal silicides, and other refractory-metal silicon nitrides, where the refractory metal includes titanium, tantalum, molybdenum, or the like. Also, other halogens, such as chlorine, bromine, and like, may be used in cleaning. The hydrazine compound is similarly expected to reduce chlorine or bromine content on the walls of the reaction chamber.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A process for forming a semiconductor device comprising the steps of:

forming a gate dielectric layer over a substrate;

forming a silicon film over the gate dielectric layer;

forming a first film over the silicon film by chemical vapor deposition using a halogen-containing tungsten source gas and a nitrogen source gas,
     wherein the first film includes tungsten and nitrogen; and forming a second film over the first film by chemical vapor deposition using a second tungsten source gas and a silicon source gas,
     wherein the second film includes tungsten and silicon;

patterning the substrate to form a gate electrode that includes the silicon film, the first film, and the second film.

2. The process of claim 1, wherein the steps of forming the first and second films are performed during a same evacuation cycle.

3. The process of claim 2, wherein:

forming the first film includes introducing the halogen-containing tungsten source gas after introducing methyl hydrazine; and forming the second film includes introducing the silicon source gas after introducing the methyl hydrazine.

4. The process of claim 3, wherein the step of introducing a silicon source gas begins after a flow rate of the methyl hydrazine decreases but before the flow rate of methyl hydrazine is terminated.

5. The process of claim 3, wherein the steps of introducing form a transition region on the first film and comprises tungsten silicon nitride.

6. The process of claim 1, wherein:

the step of forming the first film comprises a substep of introducing the halogen-containing tungsten source gas;

the step of forming the second film comprises a substep of introducing the second tungsten source gas; and the halogen-containing and second tungsten source gases are a same tungsten halide.

7. The process of claim 1, wherein the nitrogen source gas includes a constituent selected from the group consisting of hydrogen, an alkyl group, an alkenyl group, and an alkynyl group.

8. The process of claim 1, wherein:

for the step of forming the first film, the halogen-containing tungsten source gas flows in a range of approximately 4–8 sccm, and the nitrogen source gas flows in a range of approximately 5–15 sccm; and for the step of forming the second film the second tungsten source gas flows in a range of approximately 4–8 sccm, the silicon source gas flows in a range of approximately 350–600 sccm.

9. The process of claim 1, further comprising a step of etching the second film using an etch chemistry including a fluorine-containing compound and a bromine-containing compound.

10. The process of claim 9, wherein the step of etching uses the etch chemistry including sulfur hexafluoride and hydrogen bromide.

11. The process of claim 1, further comprising a step of etching the first film using an etch chemistry including a chlorine-containing compound.

12. The process of claim 11, wherein the step of etching uses the etch chemistry further including oxygen.

13. The process of claim 11, wherein the step of etching includes the chlorine-containing compound is molecular chlorine.

14. The process of claim 1, further comprising a step of etching the silicon film using an etch chemistry including molecular chlorine and hydrogen bromide.

15. The process of claim 1, further comprising steps of:
etching the silicon, first, and second films to form a gate electrode that includes the silicon, first, and second films; and
oxidizing sides of the gate electrode.

16. The process of claim 15, further comprising steps of:
forming doped regions within the substrate adjacent to the gate electrode;
forming an interlevel dielectric layer over the doped regions and gate electrode;
forming an interconnect over the interlevel dielectric layer, wherein the interconnect is electrically connected to at least one of the doped regions; and
forming a passivation layer over the interconnect.

17. The process of claim 15, wherein the process forms a memory device, and the gate electrode is a gate electrode for a memory cell within the memory device.

18. The process of claim 1, wherein the step of forming the first film is performed at a temperature of approximately 400–600 degrees Celsius.

19. The process of claim 1, wherein the steps of forming the first and second films are performed at a pressure in a range of approximately 0.3–0.9 Torr.

20. The process of claim 1, wherein:
the step of forming the first film comprises a step of depositing tungsten nitride to a thickness of approximately 50–150 angstroms; and
the step of forming the second film comprises a step of depositing tungsten silicide to a thickness of approximately 500–1500 angstroms.

21. The process of claim 1, further comprising:
forming a transition film after forming the first film and before forming the second film, wherein the transition film includes tungsten silicon nitride and has a thickness of approximately 50–100 angstroms.

22. The process of claim 1, further comprising steps of:
introducing a conductivity dopant into the silicon film; and
annealing the silicon, first, and second films, wherein the conductivity dopant does not substantially by migrate into the second film during the step of annealing.

23. A process for forming different semiconductor devices on different substrates comprising the steps of:
forming a first refractory metal-containing film for a first semiconductor device over a first substrate within a reaction chamber, wherein the first refractory metal-containing film is selected from the group consisting of a refractory metal nitride, a refractory metal silicide, and a refractory metal-silicon nitride;
cleaning the reaction chamber following the step of forming the first refractory metal-containing film, wherein this step is performed using a fluorine-containing compound;
introducing a hydrazine compound into the reaction chamber after the step of cleaning; and
forming a second refractory metal-containing film for a second semiconductor device over a second substrate within the reaction chamber after the step of introducing a hydrazine compound, wherein the second refractory metal-containing film is selected from the group consisting of a refractory metal nitride, a refractory metal silicide, and a refractory metal-silicon nitride.

24. The process of claim 23, wherein the hydrazine compound includes a constituent selected from the group consisting of an alkyl group, an alkenyl group, and an alkynyl group.

25. The process of claim 23, wherein the steps of forming the first and second refractory metal-containing films comprises steps of forming a first tungsten nitride film and forming a second tungsten nitride film.

26. The process of claim 23, further comprising steps of:
forming a first gate dielectric layer over the first substrate before the step of forming the first refractory metal-containing film; and
forming a second gate dielectric layer over the second substrate before the step of forming the second refractory metal-containing film.

27. The process of claim 26, further comprising steps of:
forming a first refractory metal suicide film over the first refractory metal-containing film before the step of cleaning; and
forming a second refractory metal silicide film over the second refractory metal-containing film,
wherein the steps of forming the first and second refractory metal-containing films include steps of forming a first refractory metal nitride and forming a second refractory metal nitride.

* * * * *